(12) United States Patent
Dubin et al.

(10) Patent No.: US 7,008,872 B2
(45) Date of Patent: Mar. 7, 2006

(54) USE OF CONDUCTIVE ELECTROLESSLY DEPOSITED ETCH STOP LAYERS, LINER LAYERS AND VIA PLUGS IN INTERCONNECT STRUCTURES

(75) Inventors: Valery M. Dubin, Portland, OR (US); Chin-Chang Cheng, Hillsboro, OR (US); Makarem Hussein, Beaverton, OR (US); Phi L. Nguyen, Hillsboro, OR (US); Ruth A. Brain, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/139,052

(22) Filed: May 3, 2002

(65) Prior Publication Data

US 2003/0207560 A1    Nov. 6, 2003

(51) Int. Cl.
*H01L 21/441*    (2006.01)

(52) U.S. Cl. ...................... 438/678; 438/627
(58) Field of Classification Search ............... 438/687, 438/678, 624, 625, 622–629, 631, 634, 636–640, 438/641, 643, 660
See application file for complete search history.

(56) References Cited

U.S. PATENT DOCUMENTS

| 4,574,094 A | 3/1986 | DeLuca et al. |
|---|---|---|
| 4,574,095 A | 3/1986 | Baum et al. |
| 4,789,648 A | 12/1988 | Chow et al. |
| 4,894,260 A | 1/1990 | Kumasaka et al. |
| 4,985,750 A | 1/1991 | Hoshino |
| 5,151,168 A | 9/1992 | Gilton et al. |
| 5,240,497 A | 8/1993 | Shacham et al. |
| 5,612,254 A | 3/1997 | Mu et al. |
| 5,619,072 A * | 4/1997 | Mehta ........................ 257/774 |
| 5,674,787 A | 10/1997 | Zhao et al. |
| 5,695,810 A * | 12/1997 | Dubin et al. .................. 427/96 |
| 5,739,579 A | 4/1998 | Chiang et al. |
| 5,891,513 A | 4/1999 | Dubin et al. |
| 6,100,184 A * | 8/2000 | Zhao et al. ................. 438/638 |
| 6,153,935 A | 11/2000 | Edelstein et al. |

(Continued)

FOREIGN PATENT DOCUMENTS

EP    1022770 A2    7/2000

(Continued)

OTHER PUBLICATIONS

"Electroless Cu for VLSI"; James S.H. Cho et al.; MRS Bulletin/ Jun. 1993, pp. 31-38.

(Continued)

*Primary Examiner*—Tuan H. Nguyen
*Assistant Examiner*—Jennifer M Dolan
(74) *Attorney, Agent, or Firm*—Blakely, Sokoloff, Taylor & Zafman LLP

(57) ABSTRACT

Multiple level interconnect structures and methods for fabricating the interconnect structures are disclosed. The interconnect structures may contain an interconnect line, an electrolessly deposited metal layer formed over the interconnect line, a via formed over the metal layer, and a second interconnect line formed over the via. Often the metal layer contains a cobalt or nickel alloy and provides an etch stop layer for formation of an opening corresponding to the via. The metal layer may provide protection to the underlying interconnect line and may replace a traditional protective dielectric layer. The metal layer is conductive, rather than dielectric, and provides a shunt for passage of electrical current between the via and the interconnect line. Similar metal layers may also be used within the interconnect structures as via liner layers and via plugs.

16 Claims, 9 Drawing Sheets

U.S. PATENT DOCUMENTS

| | | | |
|---|---|---|---|
| 6,169,024 B1 | 1/2001 | Hussein | |
| 6,174,812 B1 | 1/2001 | Hsiung et al. | |
| 6,197,688 B1 | 3/2001 | Simpson | |
| 6,207,556 B1 | 3/2001 | Hsu | |
| 6,258,707 B1 | 7/2001 | Uzoh | |
| 6,310,019 B1 * | 10/2001 | Kakizawa et al. | 510/175 |
| 6,316,359 B1 | 11/2001 | Simpson | |
| 6,342,733 B1 * | 1/2002 | Hu et al. | 257/750 |
| 6,350,687 B1 | 2/2002 | Avanzino et al. | |
| 6,358,832 B1 | 3/2002 | Edelstein et al. | |
| 6,359,328 B1 * | 3/2002 | Dubin | 257/622 |
| 6,441,492 B1 * | 8/2002 | Cunningham | 257/762 |
| 6,537,902 B1 * | 3/2003 | Orita | 438/597 |
| 6,605,874 B1 * | 8/2003 | Leu et al. | 257/758 |
| 6,613,664 B1 * | 9/2003 | Barth et al. | 438/629 |
| 6,680,540 B1 * | 1/2004 | Nakano et al. | 257/758 |
| 6,709,874 B1 * | 3/2004 | Ning | 438/3 |
| 6,878,632 B1 * | 4/2005 | Nogami et al. | 438/694 |
| 2001/0030366 A1 | 10/2001 | Nakano et al. | |
| 2001/0055873 A1 * | 12/2001 | Watanabe et al. | 438/623 |
| 2002/0027261 A1 | 3/2002 | Besser et al. | |
| 2002/0079589 A1 * | 6/2002 | Gayet et al. | 257/774 |
| 2003/0148618 A1 * | 8/2003 | Parikh | 438/694 |

FOREIGN PATENT DOCUMENTS

| | | |
|---|---|---|
| EP | 1022770 A3 | 7/2000 |
| JP | 62-270778 | 11/1987 |
| JP | 11-288940 | 7/2000 |
| WO | PCT/US03/12967 | 4/2003 |
| WO | WO 03/094209 | 11/2003 |

OTHER PUBLICATIONS

"Electroless Copper Depostion on Metals and Metal Silicides"; Cecilia Y. Mak; MRS Bulletin/Aug. 1994, pp. 55-62.

"Selective and Blanket Electroless Cu Plating Initiated By Contact Displacement For Deep Submicron Via Contact Filling"; Dubin et al.; VMIC Conf.; Jun. 27-29, 1995, pp. 315-321.

"035 um Cu-Filled Via Holes By Blanket Deposited Electroless Copper On Sputtered Seed Layer"; Yosi Shacham-Diamond et al.; VMIC Conf. ; Jun. 27-29, 1995, pp. 334-336.

"Barriers Against Copper Diffusion into Silicon and Drift Through Silicon Dioxide"; Shi-Qing Wang; MRS Bulletin/Aug. 1994, pp. 30-40.

"Inlaid Copper Multilevel Interconnections Using Planarization by Chemical-Mechanical Polishing"; S.P. Murarka et al.; MRS Bulletin/Jun. 1993, pp. 46-51.

"Electrochemically Deposited Diffusion Barriers"; M. Paunovic; et al. J. Electrochem, Soc., vol. 141, No. 7; Jul. 1994, pp. 1843-1850. © The Electrochemical Society, Inc.

"Electroless Copper Deposition For Multilevel Metallization"; S. Simon Wong et al.; Mat. Res. Soc. Symp. Proc. vol. 203; 1991 Materials Research Society, pp. 347-356.

"Thick Selective Electroless-Plated Cobalt-Nickel Alloy Contacts to CoSi2"; G.E. Georgiou, F. et al. J. Electrochem. Soc., vol. 138, No. 7, Jul. 1991; pp. 2061-2069. © The Electrochemical Society, Inc.

"Encapsulated Copper Interconnection Devices Using Sidewalls Barriers", Donald S. Gardner et al.; VMIC Conference; Jun. 11-12, 1991, pp. 99-108.

"Planar Copper-Polymide Back End of the Line Interconnections for ULSI Devices"; B. Luther et al. VMIC Conference; Jun. 8-9, 1993, pp. 15-21.

"Electroless plating of copper at a low pH level", R. Jagannathan et al.: IBM J. Res. Develop. vol. 37. No. 2: Mar. 1993, pp. 117-123.

"Selective Electroless Metal Deposition for Integrated Circuit Fabrication", Chiu H. Ting et al.; J. Electrochem Soc. vol. 136, No. 2; Feb. 1989, pp. 456-461. The Electrochemical Society, Inc.

"Selective Electroless Metal Deposition for Via Hole Filling in VLSI Multilevel Interconnection Structures"; Chiu H. Ting et al.; J. Electrochem Soc. vol. 136, No. 2; Feb. 1989, pp. 462-465. © The Electrochemical Society, Inc.

"Pd/Si plasma immersion ion implantation for selective elctroless copper plating on $SiO_2$"; Kiang et al.; Applied Phys. Lett. 60 (22): Jun. 1, 1992, pp. 2767-2769. The American Institute of Physics.

"Selective electroless Ni deposition on a TiW underlayer for integrated circuit fabrication"; V.M. Dubin et al.; Thin Solid Films, 226(1993), pp. 87-93.

"Copper Corrosion With and Without Inhibitors"; V. Brusic et al.; J. Electrochem. Soc. vol. 138, No. 8, Aug. 1991, pp. 2253-2259. ©The Electrochemical Society, Inc.

"100 nm wide copper lines made by selective electroless deposition"; Yosi Shacham-Diamand; J. Micromech. Microeng. 1 (1991). pp. 66-732.

"A Half-Micron Pitch Cu Interconnection Technology"; Kazuyoshi Ueno et al.; 1995 Symposium on VLSI Technology Digest of Technical Papers. pp. 27-28.

"Electroless Metal Deposition From Aqueous Solutions", V.V. Sviridov; Minsk Bielorussion State University; 1987. pp. 60-85.

"Passivation of Copper by Silicide Formation In Dilute Silane", S. Hymes, et al. Conf. Proc. USLI-VII, Materials Research Society; 1992, pp. 425-431.

"Copper Interconnection with Tungsten Cladding for ULSI"; J.S.H. Cho et al.; ULSI Tech. Symp; 1991; pp. 39-40.

C.J. Sambucetti et al. Electroless Deposition of Thin Alloy Layers for Metal Passivation and Solder Barriers. Aug. 31, 1997, Electromechanical Society Proceedings, vol. 97-27, pp. 336-345, XP001058382.

S.D. Lopatin et al., "Thin Elctroless Barrier for Copper Films", Proceedings of thje SPIE, SPIE Bellingham, VA, vol. 3508, Sep. 23, 1998, pp. 65-77, XP001058166.

Osaka et al., "Preparation of CoB Soft Magentic Thin Films by Electroless Plating," IEEE Translation Journal on Magnetics in Japan, vol. 6, No. 1, Jan. 1991, pp. 85-90.

Watanabe et al., "Direct Electroless Nickel Painting on Copper Circuits Using DMAB as a Second Reducing Agent, " 1998 IEMT/IMC Proceedings, pp. 149-153.

Dubin, et al., "Selective Electroless Ni Deposition onto Pd-activated Si for Integrated Circuit Fabrication," Thin Solid Films, 226, 1993, pp. 94-98.

Palmans, et al., "Deveolpment of an Electroless Copper Deposition Bath for Via Fill Application on TIN Seed Layers," Conf. Proc. ULSI-X, Materials Research Society, 1995, pp. 87-94.

* cited by examiner

USE OF CONDUCTIVE ELECTROLESSLY DEPOSITED ETCH STOP LAYERS, LINER LAYERS AND VIA PLUGS IN INTERCONNECT STRUCTURES

BACKGROUND

1. Field

Embodiments of the present invention relate to interconnect structures and fabrication methods. In particular, the embodiments relate to novel interconnect structures containing conductive electrolessly deposited etch stop layers and in some instances liner layers and via plugs, to novel methods for making the interconnect structures, and to integrated circuits containing the interconnect structures.

2. Background

Many integrated circuits contain multi-layer electrical interconnect structures to provide electrical signals to logic elements such as transistors located on a semiconductor substrate. The interconnect structures often contain interconnect lines which are spaced apart in a nearly coplanar arrangement within a dielectric material that insulates the lines from one another. Select connections between interconnect lines on different levels are made by vias formed through the insulating material.

The interconnect lines are often made of highly conductive metals or alloys. Copper has become a widely used material due in part to its low electrical resistance compared to other metals. However, one of the disadvantages of copper is that it readily oxidizes. Accordingly, if a copper surface is left exposed for prolonged periods of time, or subjected to a variety of etching or plasma cleaning operations, the surface may become oxidized. Unlike with other materials, such as aluminum, copper oxidation does not lead to a thin protective coating that blocks further oxidation, and significant portions of the copper may become oxidized. This is generally undesirable, since it may significant change the electrical and mechanical properties of the interconnect structure. Another disadvantage of copper is that it is easily etched with many of the commonly used dielectric etching chemistries. Accordingly, if the copper surface is left exposed, and unprotected, it can become oxidized or partly removed during subsequent processing operations.

In order to reduce oxidation and copper etching, protective dielectric etch stop or hard mask layers are often formed on copper interconnect lines. Materials that are commonly used for this purpose include silicon nitride (SiN), silicon carbide (SiC), and silicon dioxide ($SiO_2$). Although these dielectric layers may be effective at protecting the copper from reaction, they often contribute to mechanical separations that lead to integrated circuit failure and they may increase the effective dielectric constant of the interconnect structure and lead to reduced performance.

The protective dielectric layers provide an additional material interface or junction where mechanical separation from the protective layers in the form of pilling, cracking, or blistering often occurs. These types of mechanical failures may reduce production yields and may decrease the effective lifetime of manufactured integrated circuits. This problem may be compounded when low dielectric constant materials (low-k), which have a dielectric constant less than silicon dioxide, are used for the interconnect structure, since these materials are often chemically different from the protective dielectric layer materials.

The protective dielectric materials may also increase the effective dielectric constant of the interconnect structure, particularly when the structure contains low-k dielectric materials. Such increases in the dielectric constant may effectively decrease the speed of the integrated circuit, which depends upon interconnect signal propagation speeds. This can lead to reduced performance of the integrated circuit.

BRIEF DESCRIPTION OF THE SEVERAL VIEWS OF THE DRAWINGS

The invention may best be understood by referring to the following description and accompanying drawings that are used to illustrate embodiments of the invention. In the drawings.

DETAILED DESCRIPTION

Described herein are interconnect structures containing conductive electrolessly deposited etch stop layers, and in some embodiments liner layers or via plugs, and methods for fabricating the interconnect structures. In the following description, numerous specific details are set forth. However, it is understood that embodiments of the invention may be practiced without these specific details. For example, well-known equivalent materials may be substituted in place of those described herein, and similarly, well-known equivalent techniques may be substituted in place of the particular processing techniques disclosed. In other instances, well-known circuits, structures and techniques have not been shown in detail to avoid obscuring the understanding of this description.

I. Interconnect Structure Containing Conductive Electrolessly Deposited Etch Stop Landing for Via FIGS. 1–10 show cross-sectional views of substrates representing different stages of a method for fabricating an interconnect structure containing a conductive layer formed over an interconnect line in accordance with one embodiment of the present invention. The conductive layer serves as both an etch stop landing for a via formed over the interconnect line and as a shunt for flow of current between the interconnect line and the via.

Figure 1:
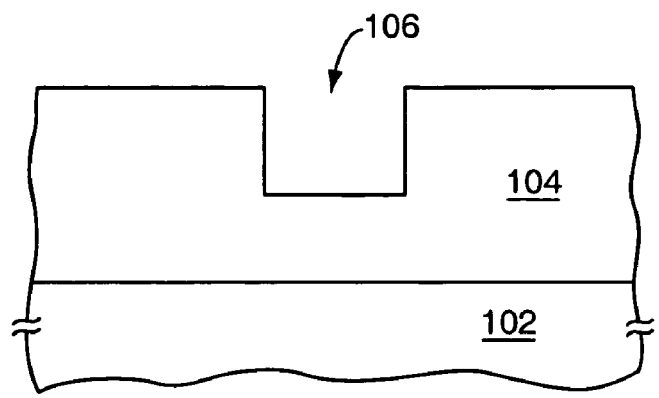
FIG. 1 shows a cross-sectional view of an integrated circuit substrate containing a semiconductor substrate, a dielectric layer formed on the substrate, and a trench formed within the dielectric layer to accommodate an interconnect line, according to one embodiment of the present invention.

FIG. 1 shows a cross-sectional view of a portion of an integrated circuit substrate containing a semiconductor substrate 102 having circuit components formed therein, a first dielectric layer 104 formed on the substrate, and a trench opening 106 formed within the dielectric layer. The dielectric layer may be formed on the substrate using deposition techniques that are well-known in the semiconductor processing arts. For example, a low-k dielectric material such as a fluorinated oxide of silicon (e.g., SiOF) or carbon doped oxide of silicon (e.g., carbon doped silicon dioxide, $SiO_2$) may be deposited by Chemical Vapor Deposition (CVD).

The trench 106 may be formed within the dielectric layer by using well-known masking, lithography, and etching techniques. For example, a radiation sensitive layer (e.g., a positive or negative photoresist) may be formed on the dielectric layer and exposed with electromagnetic radiation to create a layer having an exposure pattern corresponding to the trench. Then, a portion of the radiation sensitive layer superjacent the trench may be removed, a corresponding portion of the dielectric layer removed by etching, and then the remainder of the of the radiation sensitive layer may be removed.

Figure 2:
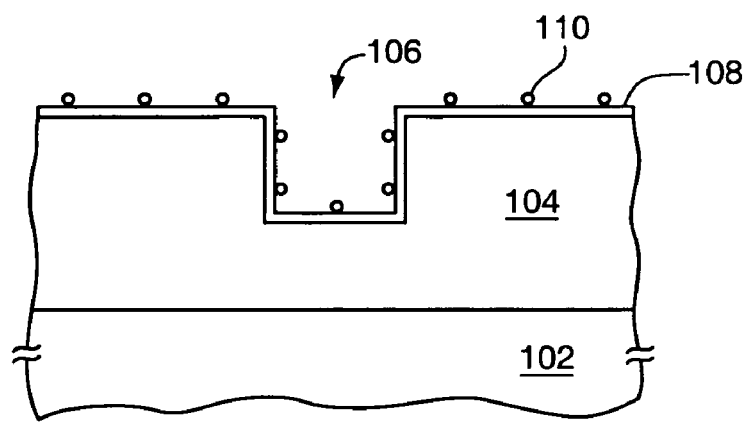
FIG. 2 shows a cross-sectional view of an integrated circuit substrate after forming a liner layer and seed material on the dielectric layer and within the trench of FIG. 1, according to one embodiment of the present invention.

FIG. 2 shows a cross-sectional view of a portion of an integrated circuit substrate after forming a liner layer 108 and seed material 110 on dielectric layer 104 of FIG. 1. The liner layer may be used to prevent undesirable interactions between material to be subsequently deposited in the trench and the dielectric material of the layer 104. The liner may be formed by depositing a thin layer of a suitable material over the surface of the dielectric layer, including on the inner surfaces of the trench 106. The liner often has a thickness between about 10–50 Angstroms (an Angstrom is 1/10,000, 000,000 of a meter, or one-tenth of a nanometer). Suitable materials for the liner include barrier layer refractory metals and alloys, such as molybdenum, nickel, cobalt, cobalt-nickel (CoNi), titanium-tungston (TiW), tantalum (Ta), tantalum-nitride (TaN), tantalum-silicon-nitride (TaSiN), titanium-nitride (TiN), titanium-silicon-nitride (TiSiN), tungsten (W), tungsten-nitride (WN), tungsten-silicon-nitride (WiSiN), and combinations of such materials (e.g., a multi-layer stack of Ta/TaN). Suitable well-known deposition techniques such as CVD, Atomic Layer Deposition (ALD), or Physical Vapor Deposition (PVD) may be used to deposit these various materials.

A small amount of the seed material 110 may be formed over the liner by a deposition process such as PVD or CVD in order to improve the subsequent deposition of conductive interconnect materials. As shown, less than a monolayer of seed material may be used for a subsequent electroless deposition. Of course, a monolayer or more may also be used. Often, if the seed material is used for an electroplating deposition at least a monolayer and often a thickness between about 30–3000 Angstroms will be used. According to some embodiments of the present invention, the seed material contains copper (Cu) or an alloy of copper (e.g., copper-tin (CuSn), copper-indium (CuIn), copper-magnesium (CuMg), copper-aluminum (CuAl)) to assist with a subsequent formation of a copper containing material thereon. These various materials may be deposited by PVD or by other well-known techniques such as CVD or ALD.

Figure 3:
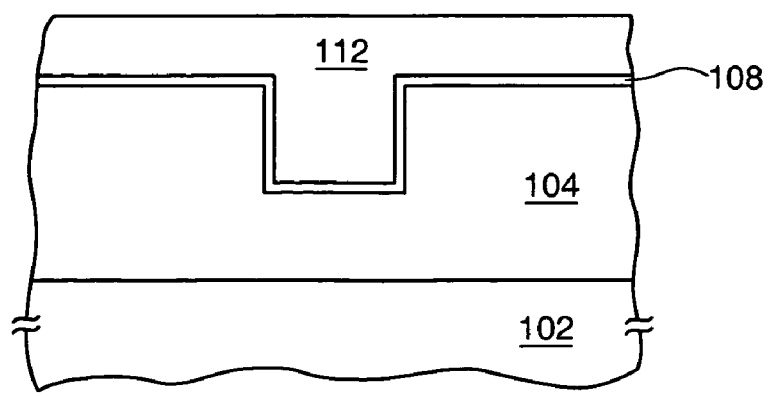
FIG. 3 shows a cross-sectional view of an integrated circuit substrate after forming a conductive layer (typically a metal layer) on the seed layer and within the trench of FIG. 2, according to one embodiment of the present invention.

FIG. 3 shows a cross-sectional view of a portion of an integrated circuit substrate after forming a conductive layer 112 on the seed layer 110 of FIG. 2. The conductive layer often contains a metal or alloy. Hereafter, the term metal will be used to include pure metals, mixtures or alloys of multiple metals, and mixtures or alloys of a metal and one or more non-metals (e.g., metalloids or non-metals). According to one embodiment of the present invention, the layer contains a conductive copper material. Exemplary copper materials include but are not limited to pure copper, or an alloy such as copper-tin (CuSn), copper-indium (CuIn), copper-antimony (GuSb), copper-bismuth (CuBi), copper-rhenium (CuRe). The material may be deposited by an electroless, electroplating or other process. An electroless deposition process differs from an electroplating process in that there is no externally supplied current from a voltage source. Although electroplating processes are commonly used, an electroless deposition may be favored for a deep, narrow, high aspect ratio trench, since continuous and thick seed layers are not needed for electroless deposition. Both depositions are well-known in the semiconductor processing arts.

Figure 4:
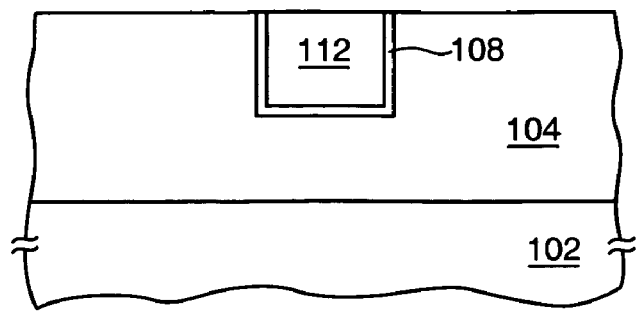
FIG. 4 shows a cross-sectional view of an integrated circuit substrate after removing portions of the conductive layer, liner, and seed material outside the trench from the substrate of FIG. 3, according to one embodiment of the present invention.

FIG. 4 shows a cross-sectional view of a portion of an integrated circuit substrate after removing portions of the conductive layer 112, liner 108, and seed material (not shown), that lie outside the trench, from the substrate of FIG. 3. These portions are typically removed by planarizing the upper surface with a chemical-mechanical polishing (CMP) or mechanical polishing, although this is not required. Those skilled in the art and having the benefit of this disclosure will recognize that depending on the thickness of the layer and the degree of planarity with which they are formed, it may be possible to eliminate this particular planarization operation. Removal of these portions creates a patterned interconnect line 112 containing conductive material within the trench. The interconnect line represents any patterned conductive material suitable to provide a signaling medium to carry electrical signals. In this field, interconnect lines are sometimes referred to as traces, wires, lines, interconnect or simply metal.

Figure 5:
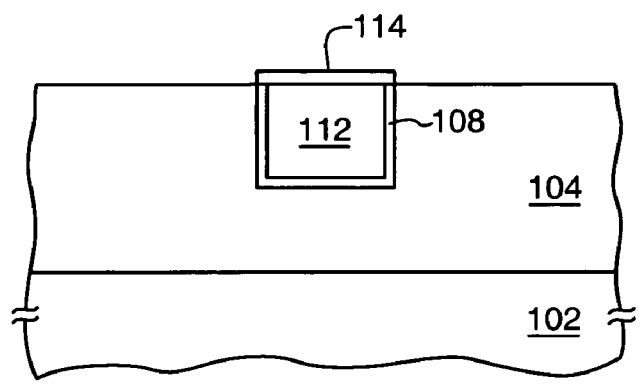
FIG. 5 shows a cross-sectional view of an integrated circuit substrate after forming a conductive electrolessly deposited layer over the interconnect line of FIG. 4, according to one embodiment of the present invention.

FIG. 5 shows a cross-sectional view of a portion of an integrated circuit substrate after forming a conductive layer 114 containing an electrolessly deposited metal over the interconnect line 112 of FIG. 4. However, prior to forming the conductive layer, which will be discussed further below, it may be desirable to clean the planarized surface to remove impurities. Experiments by the present inventors indicate that, although cleaning is not required, it may nevertheless assist in forming quality, homogeneous conductive layers.

A variety of cleansers may be adapted for cleaning the substrate of FIG. 4. One particular cleanser that has been found to be useful for removing organic impurities that can be formed on the surface during CMP includes a hot deionized water solution containing effective amounts of a surfactant to help wet the surface, an etching agent sufficient to slowly etch a copper interconnect line to assist with removing organic that is tightly bonded to the copper, and a reducing agent to reduce the oxidation number of the copper and help activate it for the subsequent electroless deposition. Suitable surfactants include but are not limited to RHODAFAC #RE610, available from Rhone-Poulenc, and Triton X100, available from Sigma-Aldrich. An alcohol such as ethyleneglycol or isopropyl alcohol may also be used in place of the surfactant. Suitable etching agents include an appropriately weak solution of an acid with <10 wt % in water (e.g., a strong mineral acid like hydrofluoric acid, nitric acid, or sulfuric acid, or a weak organic or carboxylic acid like citric acid or malonic acid). Ammonia may also be used to etch a copper material. Suitable reducing agents include among others glyoxylic acid.

The cleanser may contain other agents such as a base like TMAH (tetra methyl ammonium hydroxide) or potassium hydroxide and an oxidizer like hydrogen peroxide. The base is often used in an aqueous concentration of less then about 10 wt %. Of course, these cleaners may be replaced by other cleaners, or cleaning avoided altogether, so long as the surface of the interconnect line is sufficiently clean to allow electroless deposition of the cobalt alloy layer. Sonic agitation or scrubbing may be used in order to dislodge particles and improve cleaning.

Returning now to FIG. 5, we recall that the conductive electrolessly deposited layer 114 has been formed on the exposed (often cleaned) surface of the interconnect line 112 of FIG. 4. As shown, the layer often forms on the liner layer 108 although this depends upon the particular materials. The layer may have a range of thickness, including a thickness between about 10–100 nanometers in one instance. The layer 114 may passivate and protect the interconnect line 112 and may serve as an etch stop layer during fabrication and as a conductive shunt layer during device operation.

The layer 114 may be formed by chemical deposition of a metal through a chemical reaction. According to one embodiment of the present invention, the layer may be formed by an electroless deposition wherein a substrate is placed in a solution, containing a metal containing compound (e.g., a metal complex) and a reducing agent, and a metal is deposited at an electrochemically active surface of the substrate through an autocatalytic oxidation-reduction (redox) reaction between the metal containing compound and the reducing agent at the surface. The reaction reduces the metal ions by giving them electrons until they deposit in a non-ionic metallic state on the surface.

The layer 114 may contain metals such as cobalt, nickel, or alloys of these metals. Alloys may be desired over either pure cobalt or nickel. For one thing, the alloy may be substantially amorphous and may present a tighter barrier to diffusion and electromigration than a crystalline layer of a pure metal. For example, experiments indicate that a layer of a pure cobalt metal may have significant crystal regions that allow easy diffusion of copper and other materials along crystal grain boundaries, whereas an alloy layer of cobalt-tungsten-phosphorous may provide a better barrier due to tungsten filling in the crystal boundaries to reduce diffusion through these regions. Often, the alloy will contain cobalt or nickel and between one and typically about four other materials, such as metals (e.g., transition elements, cobalt, nickel, and tungsten), metalloids (e.g., boron), or non-metals (e.g., phosphorous). Of course more than four materials may be included, as desired.

According to one embodiment of the present invention, the layer contains a cobalt-boron-phosphorous (CoBP) alloy having a concentration of boron that is between about 1–10 atomic percent (at %), a concentration of phosphorous that is between about 1–20 at %, and the remainder of the concentration (i.e., between about 70–98 at %) made up by cobalt. This layer may be formed by preparing a suitable electroless deposition solution, immersing the substrate in the solution, allowing the reaction to proceed until a layer having a desired thickness has formed, and then removing the substrate from the solution.

Solutions that are suitable for electroless deposition of a CoBP metal layer can be prepared by combining in solution a salt of cobalt (e.g., cobalt sulfate, cobalt chloride), a complexing agent to complex cobalt and help keep it in solution (e.g., EDTA, a carboxylic acid, citric acid, malonic acid, succinic acid, ethylenediamine, propionic acid, acetic acid), a first reducing agent that contains boron (e.g., dimethylamine borane (DMAB) or borohydride), and a second reducing agent that contains phosphorous (e.g., hypophosphite). The alloy components come from a complex of the cobalt, which forms when the salts dissolve and the cobalt ions are complexed by the complexing agents, and from the reducing agents. Typically, the pH of the solution will affect the deposition process and it will be desirable to add a base such as TMAH, potassium hydroxide, ammonium hydroxide, or some combination of these to maintain the pH between about 7 and about 11. It may also be desirable to include a buffer agent, such as ammonium chloride ($NH_4Cl$) or ammonium sulfate ($(NH_4)_2SO_4$), to further stabilize the solution pH. For example, in one particular instance, the solution contains between about 16–24 g/L $CoCl_2\cdot 6H_2O$, about 10–16 g/L DMAB, about 1.8–2.2 g/L $H_2PO_2$, about 30–46 g/L citric acid, about 026–40 g/L $NH_4Cl$, about 266–400 $cm^3$/L of 25% TMAH solution to give a pH between about 8.9–9.3.

It is appreciated that other electroless deposition solutions are contemplated. For instance, a nickel alloy may be created by adding a nickel salt such as nickel chloride in place of, or in addition to, the cobalt salt described above. As yet another example, tungsten may be introduced by adding $(NH_4)_2WO_4$ to the solution.

After preparing the solution and immersing the substrate, it is common to heat the solution, the substrate, or both in order to increase the deposition rate. Most commonly, the reactions are carried out at temperatures between about 25° C. (room temperature) and about 100° C. to avoid the solution boiling. Often, the desired temperature is between about 35° C. and about 85° C. Exemplary deposition rates, which depend upon the particular temperature and chemical reactions, often are between about 10–200 nanometers/min. The substrate may remain immersed in the solution until the deposition process achieves the desired layer thickness.

It is well known in the semiconductor processing arts that active surfaces are needed for electroless deposition to occur effectively. The active surface should be receptive to the autocatalytic growth of the electrolessly deposited metal. Copper is active for the present cobalt-boron-phosphorous alloy. However, it is contemplated that in another embodiment of the present invention, wherein a non-active metal is desired for the interconnect line, an active metal such as copper, cobalt, nickel, palladium, platinum, or gold be deposited on the non-active metal prior to electroless deposition.

Optionally, the substrate may be cleaned after forming the layer 114 of FIG. 5 in order to remove impurities associated with the electroless solution. A suitable cleanser may contain an aqueous solution of a surfactant or alcohol to help wet the surface and an acid or oxidizer to mildly etch the alloy material in order to improve the cleaning.

The deposition process described above is often able to deposit layers having electrical resistivities of less than about 70 micro Ohms per centimeter and surface roughness (Ra) of less than about 5 nanometers (for layers having thickness up to about 200 nanometers). These layer attributes may be sufficient for many applications. However, both the surface roughness and electrical resistance may be further reduced by an annealing process, which modifies the structural and material properties of the layer. A suitable annealing process may include heating the layer in either an inert atmosphere (e.g., a noble gas, nitrogen) or reducing atmosphere (e.g., hydrogen) to a temperature of about 450° C. This may include ramped heating for several minutes to an hour in a furnace, or performing a rapid thermal anneal that lasts several minutes. This form of treatment may be useful to remove gases such as hydrogen that are incorporated during the electroless deposition process. This may decrease the resistance of the layer. The heating may also soften the layer and cause a general reduction in the roughness.

During annealing, a trace amount of oxygen may be added to the atmosphere to oxidize the upper surface of the layer. This sort of oxidation may make the contact portion of the layer more compatible with a subsequently deposited dielectric layer, so that the layer and the dielectric layer have good contact and adhesion. This may reduce mechanical failures like blistering and may improve production yields.

Figure 6:
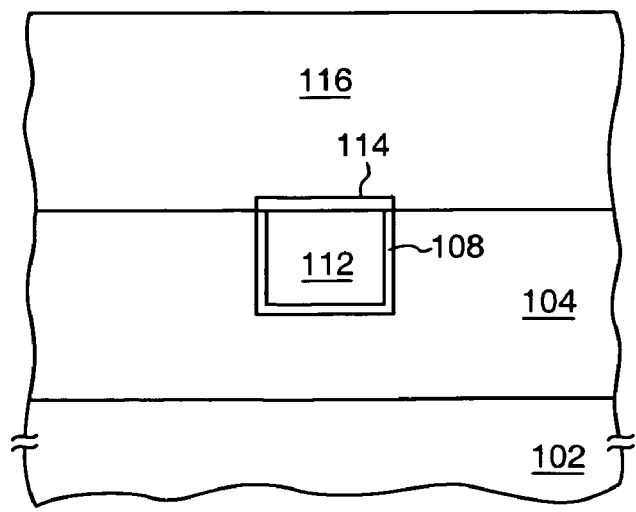
FIG. 6 shows a cross-sectional view of an integrated circuit substrate after forming a second dielectric layer on the existing dielectric layer and the conductive electroless layer of FIG. 5, according to one embodiment of the present invention.

FIG. 6 shows a cross-sectional view of a portion of an integrated circuit substrate after forming a second dielectric layer 116 on the first dielectric layer 104 and the conductive layer 114 of FIG. 5. The dielectric layer may be formed by using deposition techniques that are well-known in the semiconductor processing arts. For example, the dielectric may comprise fluorinated silicon oxide deposited by known CVD methods.

As shown, the dielectric layer 116 may be formed directly on the dielectric and electroless layers, without a dielectric hard mask or etch stop layer containing materials such as SiN, SiC, or $SiO_2$, disposed between the layers 104 and 116. These dielectric layers are typically formed over the layer 114 to protect the layer. The hard mask and etch stop layers are not needed, since the conductive layer 114 provides protection to the subjacent interconnect line. The elimination of such layers can improve contact and adhesion between the first and second dielectric layers, particularly when these layers contain similar dielectric materials. This may improve production yields, due to a reduction in the number of failing devices, and may improve the reliability and operational lifetime of integrated circuits.

In addition, when the first dielectric layer and/or the second dielectric layer contain a low-k dielectric material, the elimination of the dielectric hard mask or etch stop layers may avoid an increase in the effective dielectric constant of the dielectric layers 104 and 116. As an example, when SiN, SiC, or $SiO_2$ hard mask or etch stop layers are present, they may increase the effective dielectric constant of the dielectric region by 10%, or more. Avoiding this increase in the effective dielectric constant can lead to a decrease in the capacitance of the dielectric region (due to the dielectric constant) without impacting the resistance through the interconnects. Advantageously, this can increase the speed of signal propagation through the interconnect structure and ultimately increase the speed of the integrated circuit. Of course, the elimination of these layers may also simplify the fabrication process and help reduce fabrication costs.

Although it is an aspect of one embodiment of the present invention that a hard mask not be formed above the interconnect line 112, any existing hard mask may be removed during the cleaning operations that proceed forming the conductive layer 114 as desired. For example, in the event of a $SiO_2$ hard mask, a solution containing diluted hydrofluoric acid or similar agent may be used to dissolve and remove the hard mask. As discussed above, removal of this layer may lead to improved performance and reliability for the integrated circuit.

Figure 7:
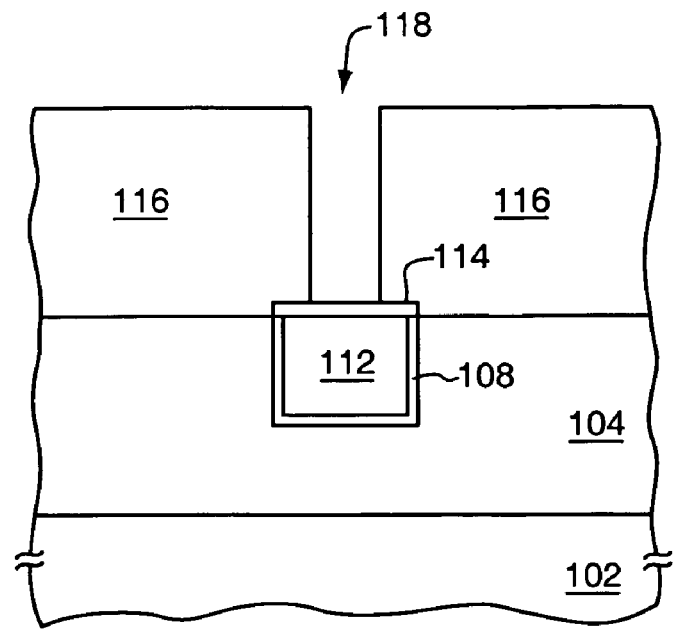
FIG. 7 shows a cross-sectional view of an integrated circuit substrate after forming an opening to accommodate a via in the second dielectric layer of FIG. 6, according to one embodiment of the present invention.

FIG. 7 shows a cross-sectional view of a portion of an integrated circuit substrate after forming an opening 118 in the dielectric layer 116 of FIG. 6 over the first interconnect line. The opening spans the entire thickness of the layer down to but not substantially into the conductive layer 114. The opening may have a width that is sufficient to accommodate a via plug, which width may be narrower than the width of the interconnect line 112. The term via is sometimes used in the art to describe both an opening in the dielectric in which the structure will be completed, and the completed structure itself. In the present disclosure, unless otherwise specified, via refers to the completed structure including a via plug within the opening.

The opening may be formed by selectively removing dielectric material relative to material of the conductive layer. In one instance, the opening may be formed by using masking and lithography methods, such as those used to pattern the trench 106 of FIG. 1, followed by an etch to remove dielectric material from the opening 118 without removing (or significantly removing) material from the conductive layer 114. The conductive layer 114 may be an etch stop layer for formation of the via opening. One exemplary etch that is suitable to remove dielectric material, such as a fluorinated oxide of silicon or carbon doped oxide of silicon, without significantly removing the conductive layer, is a dry etch with a reactive plasma or ionized gas of oxygen/nitrogen or fluorine.

Figure 8:
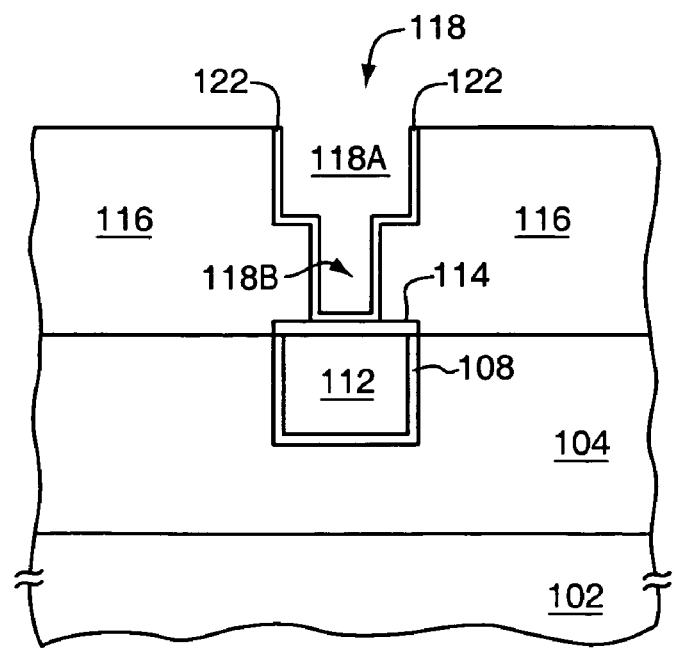
FIG. 8 shows a cross-sectional view of an integrated circuit substrate after forming an opening to accommodate a second interconnect line at the top of the via opening of FIG. 7, according to one embodiment of the present invention.

FIG. 8 shows a cross-sectional view of a portion of an integrated circuit substrate after removing dielectric material from around the top of the opening 118 of FIG. 7 to form opening region 118A having a width that is sufficient to accommodate an interconnect line. The dielectric material may be removed by using mask, lithography, and selective etch operations such as those used to form the opening 118 of FIG. 7. An alternate embodiment of the present invention is also contemplated wherein the region 118A may be formed, including by an etch chemistry that need not be selective to the layer 114 before forming the opening 118B by selectively etching down to but not significantly into the layer 114.

After any desired cleaning of exposed surfaces with cleansers that are compatible with the conductive layer 114, liner layer 122 may be formed respectively on the inner surfaces of the opening 118 of FIG. 8. Typically, these layers are formed by CVD, PVD, or ALD of a material such as those used for layer 108 of FIG. 2, although this is not required.

Figure 9:
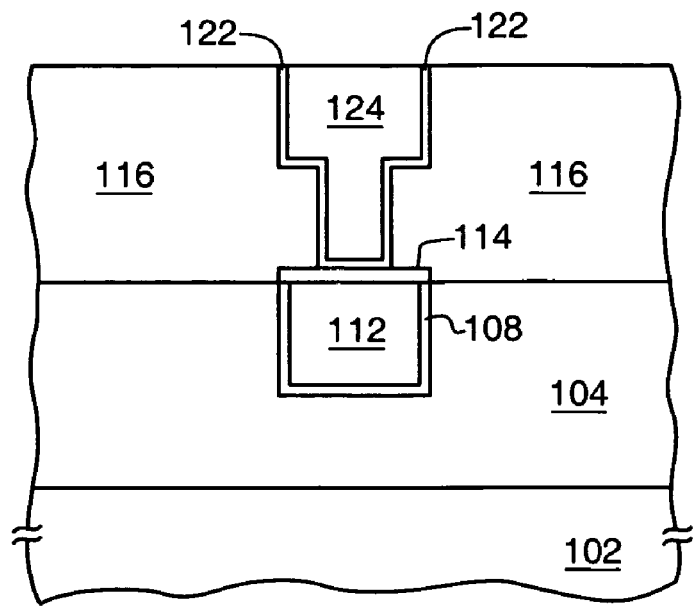
FIG. 9 shows a cross-sectional view of an integrated circuit substrate after adding conductive interconnect material to fill the opening of FIG. 8, according to one embodiment of the present invention.

FIG. 9 shows a cross-sectional view of a portion of an integrated circuit substrate after adding conductive material 124 to fill the opening 118 of FIG. 8. Adding the conductive material may include forming a layer of conductive material, such as that of 112, on the dielectric layer 116 and within the opening 118 by a suitable deposition method, and then removing portions of the formed layer that are outside the opening 118 by planarization with CMP (e.g., by a damascene process). Several other approaches that are contemplated will be discussed below.

Figure 10:
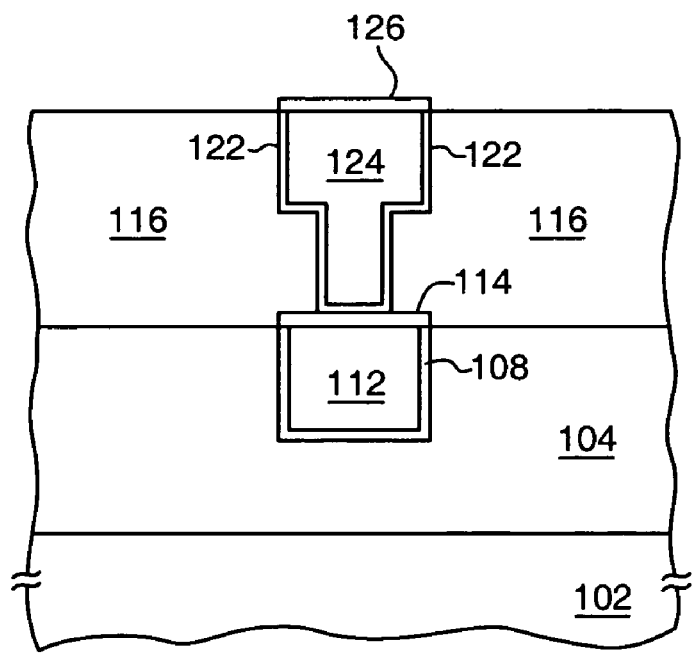
FIG. 10 shows a cross-sectional view of an integrated circuit substrate after forming a conductive electrolessly deposited layer on top of the conductive interconnect material (the second interconnect line) of FIG. 9, according to one embodiment of the present invention.

FIG. 10 shows a cross-sectional view of a portion of an integrated circuit substrate after forming a conductive electrolessly deposited layer 126 on top of the conductive interconnect material 124 of FIG. 9. The layer may be formed by pre-cleaning, electroless deposition, post-cleaning, and annealing, such as previously disclosed in regards to the layer 114 of FIG. 5, although this is not required.

Accordingly, FIGS. 1–10 show a method for forming an interconnect structure containing a conductive layer formed over an interconnect line, the conductive layer serving as an etch stop landing for fabrication of a via over the interconnect line, and the conductive layer serving as a shunt for passage of electrical current between the conductor 124 and the interconnect 112 during device operation. It is to be appreciated that additional levels may be formed over the interconnect structure of FIG. 10. It is also to be appreciated that the interconnect line 112 of FIG. 4 may be connected within circuit component in the substrate 102.

II. Interconnect Structure Containing Conductive Electrolessly Deposited Etch Stop for Unlanded Via FIGS. 11–12 show cross-sectional views of substrates representing different stages of a method for fabricating an interconnect structure containing a conductive electrolessly deposited etch stop layer and an unlanded via formed in regions both over and under the conductive layer, in accordance with one embodiment of the present invention.

Figure 11:
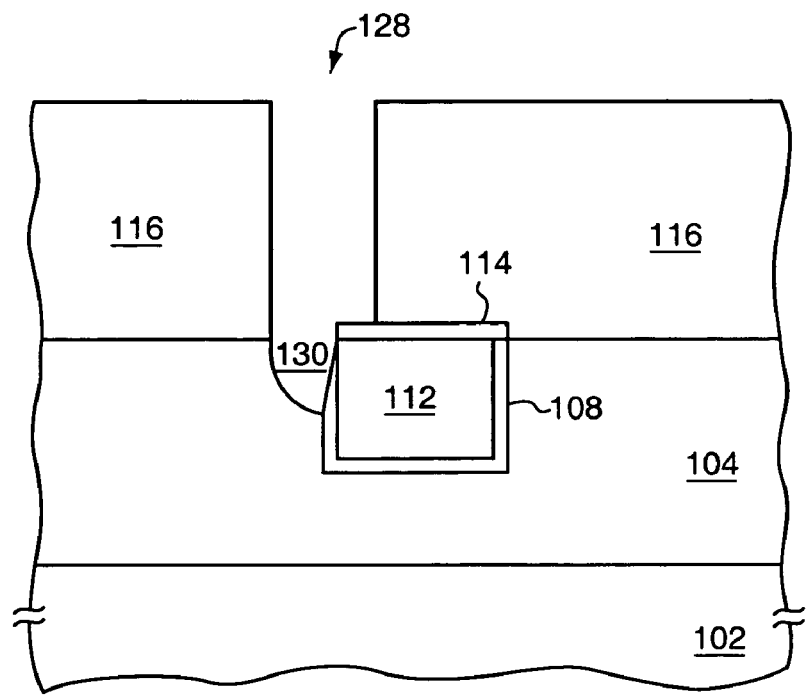
FIG. 11 shows a cross-sectional view of an integrated circuit substrate after forming an opening to accommodate an unlanded via in dielectric layers such as those shown in FIG. 6, according to one embodiment of the present invention.

FIG. 11 shows a cross-sectional view of a portion of an integrated circuit substrate after forming an opening 128 in the dielectric layer 116, the dielectric layer 104, the layer 108, and potentially a portion of the copper 112 of a substrate similar to that shown in FIG. 6. The opening may be patterned by well-known mask and lithography operations, with a portion of the pattern for the opening overlying the layer 114 and another portion of the pattern overlying dielectric at a left-hand side of the layer 114, followed by an etch that is selective to etch the dielectric materials without significantly etching the layer 114. That is, the layer 114 may be used as an etch stop layer. The etch may form a first opening portion above the layer 114 and a second overetch opening portion 130 in the dielectric layer 104 alongside the interconnect line 112 and below the layer 114. As desired, a longer or harsher etch may be used to remove a portion of the liner layer 108 and the interconnect line 112.

Figure 12:
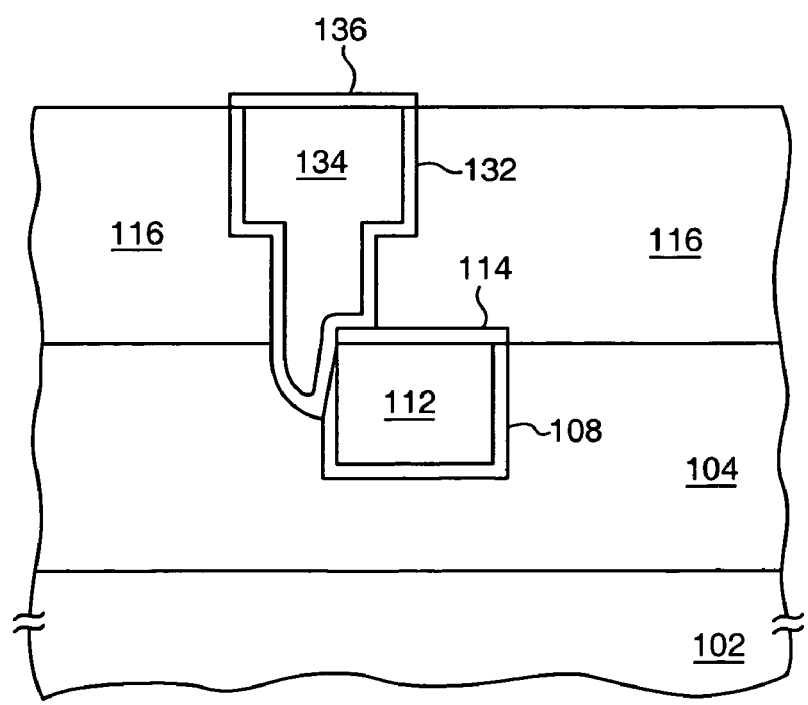
FIG. 12 shows a cross-sectional view of an integrated circuit substrate containing a multi-level interconnect structure having an electrolessly deposited conductive layer as an etch stop layer for an unlanded via, according to one embodiment of the present invention.

FIG. 12 shows a cross-sectional view of a portion of an integrated circuit substrate containing a multiple level interconnect structure, in accordance with one embodiment of the present invention. The interconnect structure may be created by removing dielectric material at the top of the opening 128, to allow the opening to accommodate an interconnect line, forming a liner and seed layer 132 within the modified opening, forming conductive material 134 representing an interconnect line and via over the liner and seed layer, and then forming a conductive layer 136 on the interconnect line of 134. Each of these structures may be formed as previously described, or by other techniques that are well known in the semiconductor processing arts. If PVD process is used to deposit liner and seed layer 132, an electroless deposition process, such as previously described, may be used to make PVD liner/seed continuous in a high aspect ratio structure.

III. Interconnect Structure Containing Conductive Electrolessly Deposited Etch Stop for Unlanded Via Containing Conductive Electrolessly Deposited Via Plug FIGS. 13–14 show cross-sectional views of substrates representing different stages of a method for fabricating an interconnect structure containing a conductive electrolessly deposited via plug 138, in accordance with one embodiment of the present invention.

Figure 13:
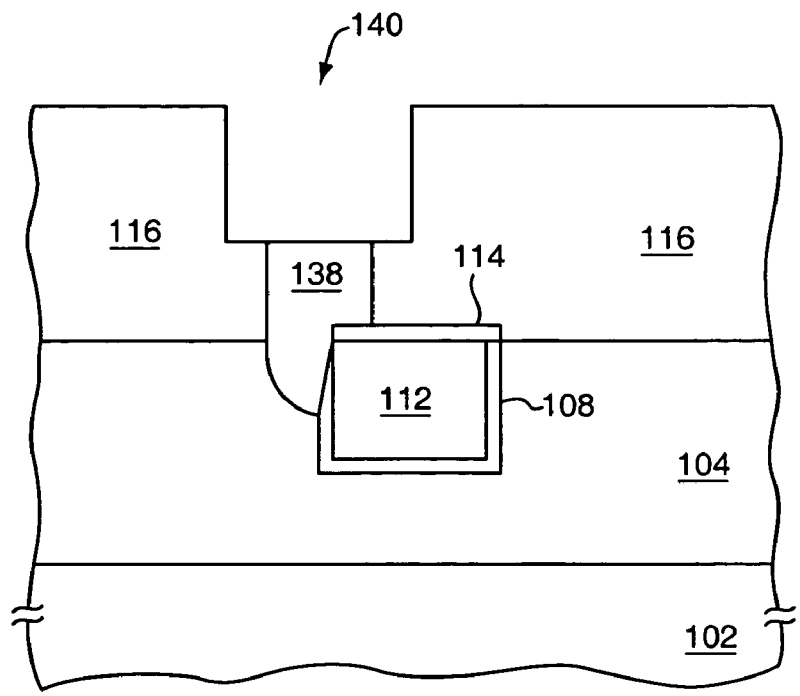
FIG. 13 shows a cross-sectional view of an integrated circuit substrate after forming an unlanded via by electrolessly depositing a conductive material on a bottom portion of an opening, according to one embodiment of the present invention.

FIG. 13 shows a cross-sectional view of a portion of an integrated circuit substrate after forming a via 138 by electrolessly depositing a cobalt or nickel material on a bottom portion of an opening 140 to accommodate an unlanded via and an interconnect line. The material is selectively deposited on exposed active surfaces of the layer 114, the liner 108, and any exposed portions of the interconnect line 112. The via may be grown from these active surfaces to fill the opening. Deposition may be stopped when the desired via plug size has been obtained. The use of such electrolessly deposited via plugs may be desired for narrow, high aspect ratio openings, such as those having a width that is between about 0.05–0.075 micrometers (a micrometer is $\frac{1}{1,000,000}$ of a meter), since the electroless deposition process is able to deposit material uniformly within such spaces.

Figure 14:
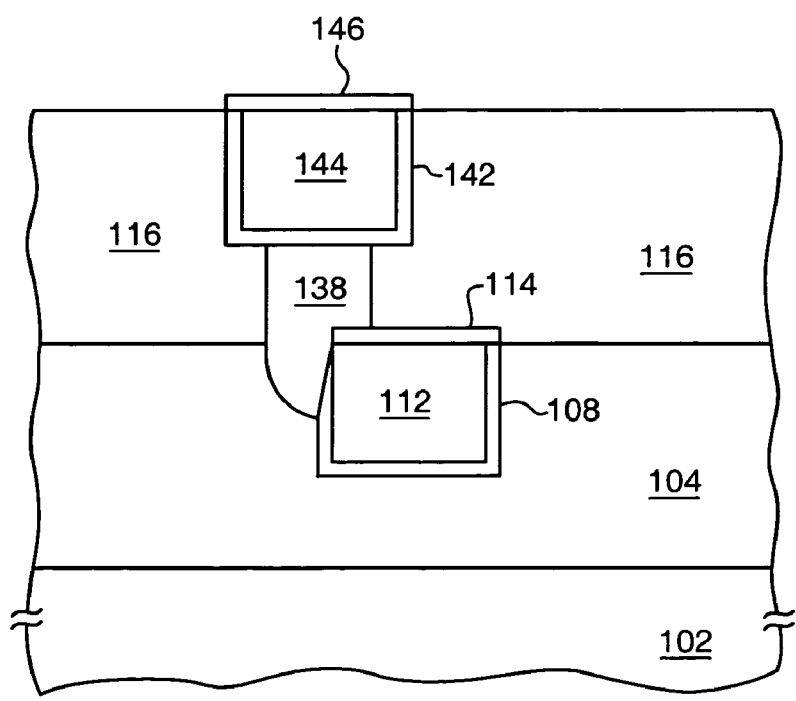
FIG. 14 shows a cross-sectional view of an integrated circuit substrate containing a multi-level interconnect structure having a conductive electrolessly deposited via plug, according to one embodiment of the present invention.

FIG. 14 shows a cross-sectional view of a portion of an integrated circuit substrate containing a multiple level interconnect structure containing a conductive electrolessly deposited via plug containing a cobalt or nickel material, in accordance with one embodiment of the present invention. The interconnect structure may be created by forming a liner layer 142 on exposed portions of the remaining opening 140 of FIG. 13, forming an interconnect line 144 on the liner layer, and a forming an conductive electrolessly deposited layer 146 on the interconnect line. Each of these structures may be formed as previously described, or by other techniques that are well known in the semiconductor processing arts.

It is an aspect of one embodiment of the structure shown in FIG. 14 that a composition of the plug 138 be different than a composition of the liner 142. For example, in the case of an alloy containing boron and phosphorous, the boron and phosphorous may enhance the diffusion barrier of a material, which may be useful for a liner layer, while at the same time increasing slightly the electrical resistance, which may not be desired for a via. Accordingly, the plug may have a lesser total concentration of boron and phosphorous relative to the liner layer. In one particular instance, the plug 138 may contain <10at % phosphorous and <5 at % boron and the liner layer 142 may have >10 at % phosphorous and >5 at % boron.

IV. Interconnect Structure Containing Conductive Electrolessly Deposited Etch Stop For Unlanded Via Containing Conductive Electrolessly Deposited Liners FIGS. 15–16 show cross-sectional views of substrates representing different stages of a method for forming a conductive electrolessly deposited liner layer 150 between conductive interconnect materials 152 and dielectric materials 104, 116 in accordance with one embodiment of the present invention.

Figure 15:
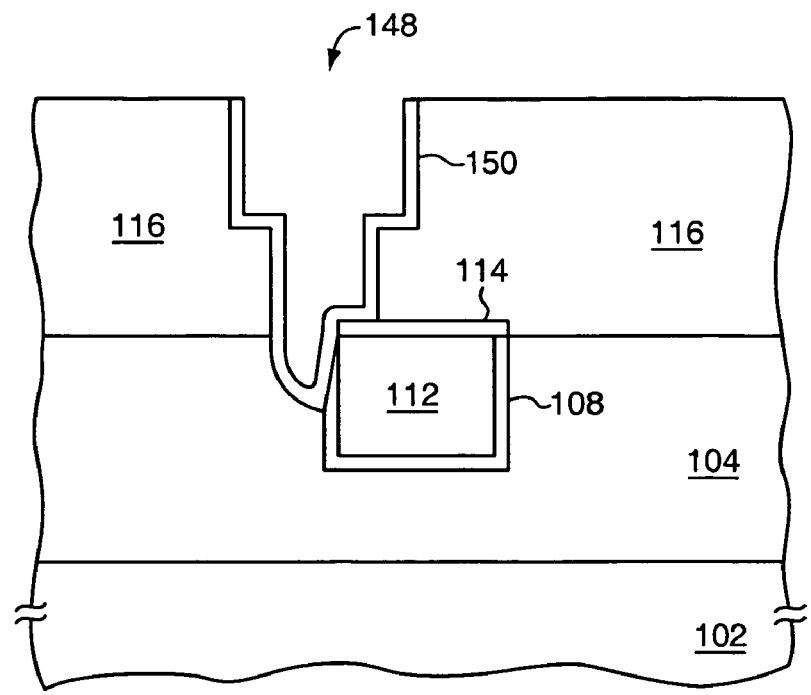
FIG. 15 shows a cross-sectional view of an integrated circuit substrate after forming a liner layer on exposed surfaces of an opening, according to one embodiment of the present invention.

FIG. 15 shows a cross-sectional view of a portion of an integrated circuit substrate after forming a liner layer 150 on exposed surfaces of an opening 148 to accommodate an unlanded via and interconnect line. Prior to forming the liner layer, the exposed surfaces of the dielectric layers 104 and 116 may be activated for electroless deposition. This may include using PVD to deposit a thin layer of an active metal such as copper, cobalt, or nickel. This may be followed by electroless deposition of a cobalt or nickel alloy on the activated surfaces. In one particular embodiment of the present invention, about a monolayer of cobalt is sputtered or thermally evaporated onto the entire inner surface of the opening and then a cobalt-boron-phosphorous alloy is electrolessly deposited on the cobalt. Compared to prior art barrier layers formed by PVD and like deposition methods, the electrolessly deposited liner layer may have more conformal and uniform coverage of the exposed surfaces. This may be particularly true in high aspect ratio openings and may make the use of electroless deposition desirable for such structures. The present inventors have found that a thin liner layer of cobalt-boron-phosphorous alloy having a thickness of less than about 10 nanometers may provide an effective barrier to electromigration of copper due to for instance current flow. However, thin layers are not required.

Figure 16:
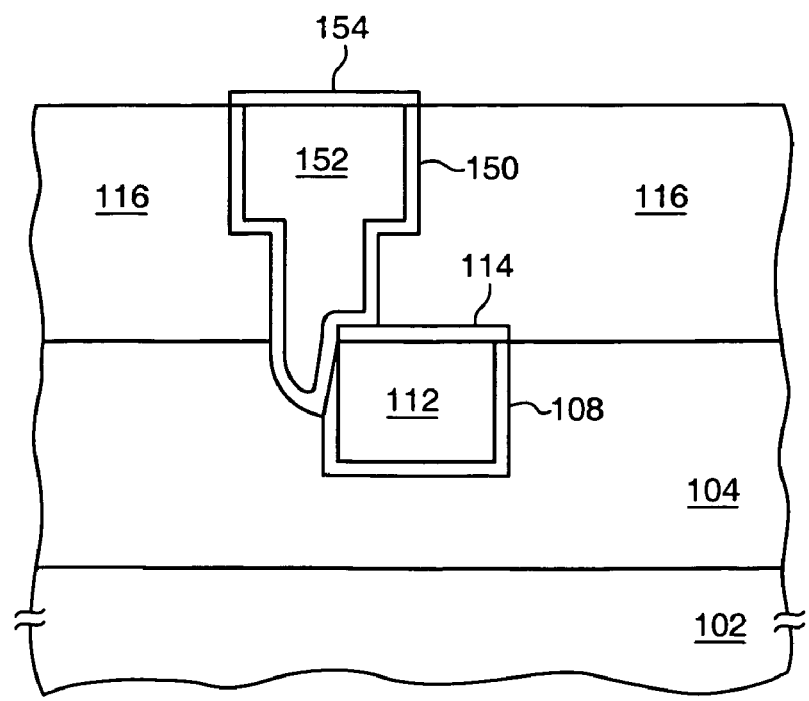
FIG. 16 shows a cross-sectional view of an integrated circuit substrate containing a multi-level interconnect structure having an electrolessly deposited liner layer as a barrier between interconnect materials and dielectric, according to one embodiment of the present invention.

FIG. 16 shows a cross-sectional view of a portion of an integrated circuit substrate after filling the opening 148 of FIG. 15 with conductive interconnect materials 152, representing a via and an interconnect line, on the liner layer 150, and after forming a conductive electrolessly deposited metal layer 154 over the top surface of the conductive interconnect materials 152. According to one embodiment of the present invention, a copper material may be deposited on the liner layer by using an electroless or electroplating process. As desired, the surface of the liner layer may be cleaned or pre-wet, prior to depositing conductive interconnect materials, with an aqueous solution containing a suitable surfactant. The conductive layer 154 may be formed as previously described, and it should be noted that the layer may form on the liner layer 150 in addition to on the conductive interconnect material 152.

V. Interconnect Structure Containing Inlaid Conductive Electrolessly Deposited Etch Stop for Via Fabrication FIGS. 17–18 show cross-sectional views of substrates representing different stages of a method for fabricating an interconnect structure containing an inlaid conductive electrolessly deposited layer formed over an interconnect line, in accordance with one embodiment of the present invention.

Figure 17:
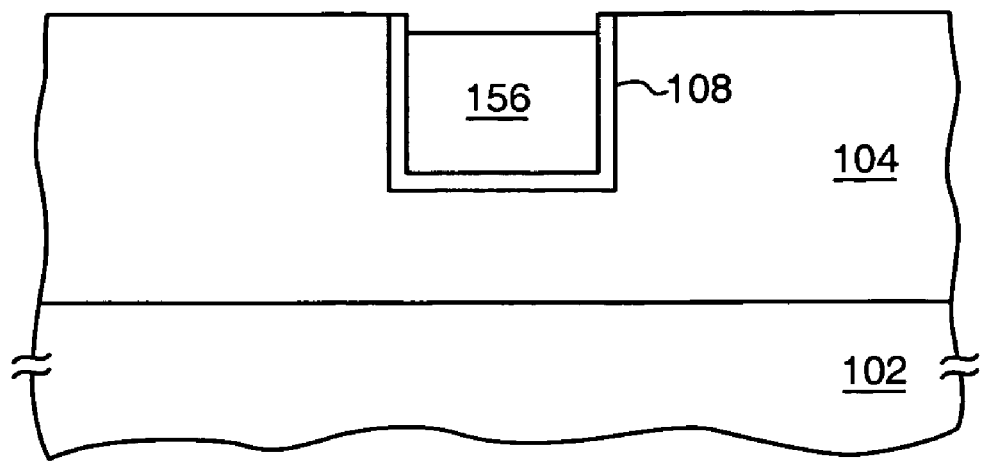
FIG. 17 shows a cross-sectional view of an integrated circuit substrate after forming a recessed interconnect line by removing material from a top exposed surface of an interconnect line such as the one shown in FIG. 4, according to one embodiment of the present invention.

FIG. 17 shows a cross-sectional view of a portion of an integrated circuit substrate containing a recessed interconnect line 156 formed by removing material from a top exposed surface of an interconnect line similar to line 112 of FIG. 4. In one embodiment of the present invention. The material may be a copper material that is removed by using a chemical etch with a weak solution of sulfuric acid that preferentially etches the copper material over dielectric materials such as fluorinated oxide of silicon or carbon doped oxide of silicon. This may allow recessing the interconnect line relative to the dielectric layer. It is also contemplated that the etching could be performed during a post-planarization cleaning operation by including sufficient amounts of copper etching agents in the cleanser (more than would be used if recessing the interconnect line was not desired). Suitable etching agents include acids such as sulfuric acid, ammonium hydroxide, and others.

Figure 18:
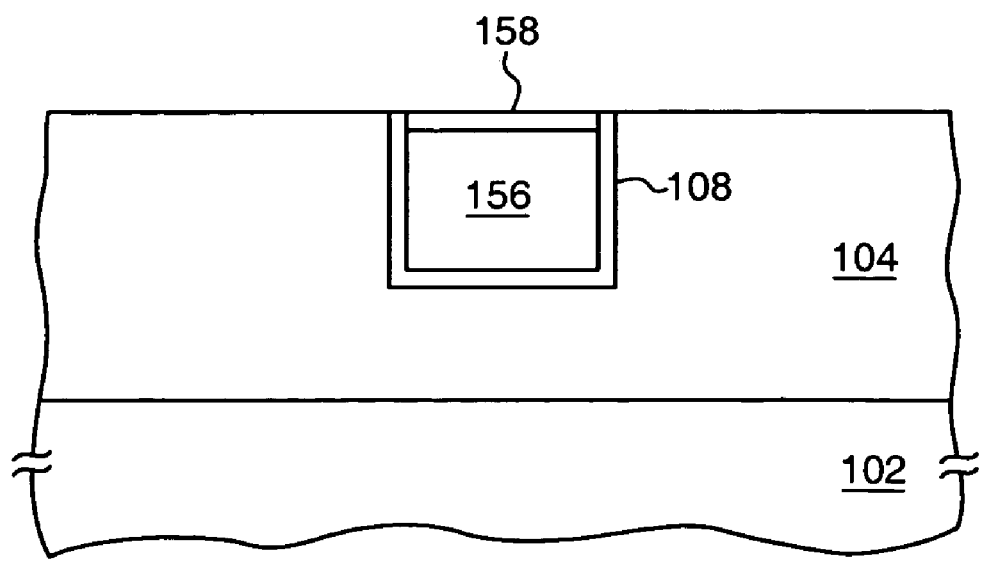
FIG. 18 shows a cross-sectional view of an integrated circuit substrate after forming an inlaid conductive electrolessly deposited layer over the recessed interconnect line of FIG. 17, according to one embodiment of the present invention.

FIG. 18 shows a cross-sectional view of a portion of an integrated circuit substrate after forming an inlaid conductive electrolessly deposited layer over the interconnect line 156 of FIG. 17. A planar surface may be created by selective electroless deposition until the planar surface is achieved, or a CMP planarization may be performed after the deposition.

VI. Use in Computer Systems

Interconnect structures such as those described herein may be used in chips, integrated circuits monolith devices, semiconductor devices, and microelectronic devices as they are generally understood in the field. These integrated circuits may contain circuit components to that are electrically coupled with the interconnect structure to receive signals from the interconnect structure. One exemplary integrated circuit is a microprocessor.

Figure 19:
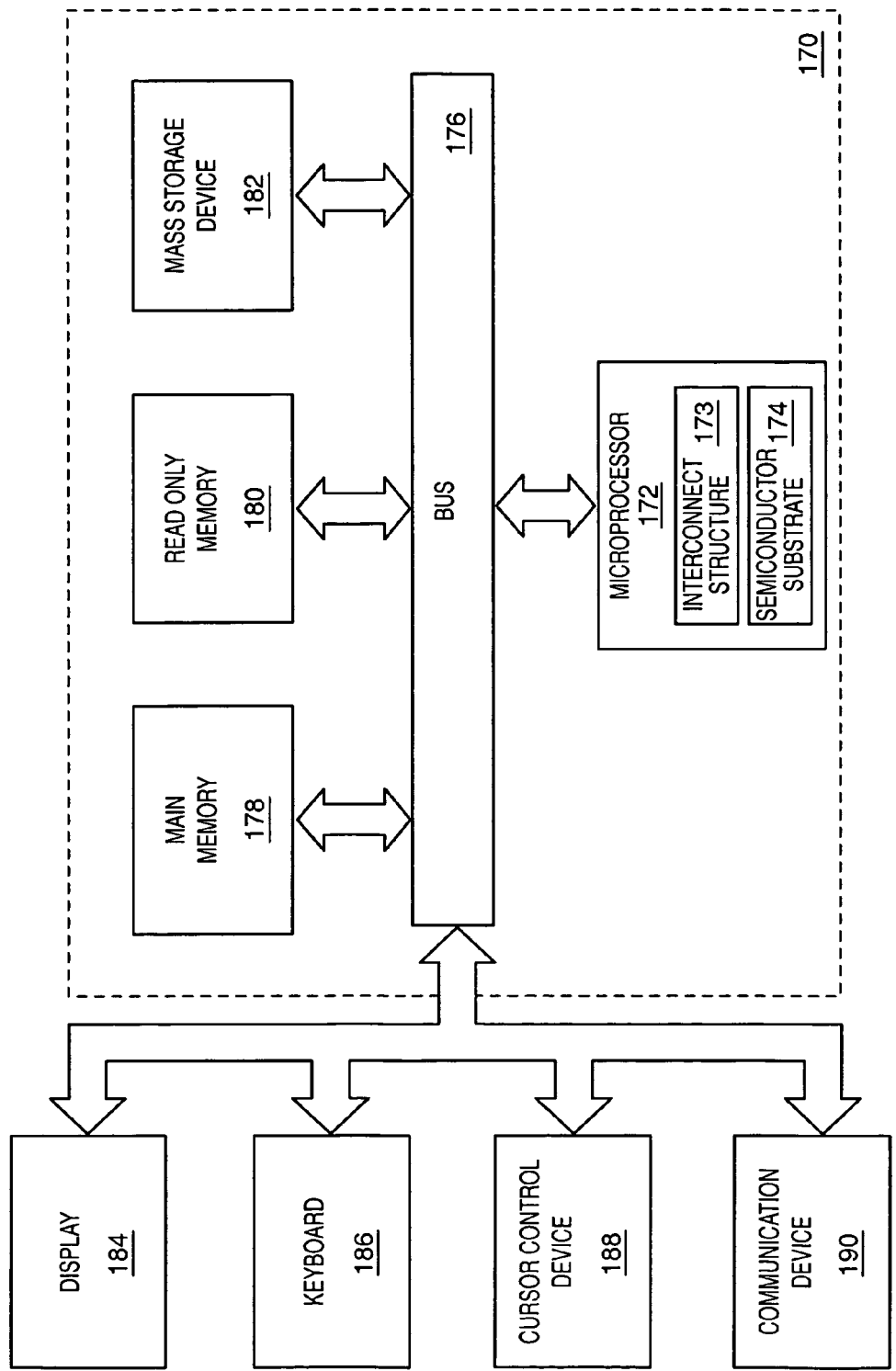
FIG. 19 shows a computer system containing a microprocessor having an interconnect structure, in accordance with an embodiment of the present invention.

Integrated circuits containing the interconnect structures disclosed herein may be incorporated in various forms electrical systems including computer systems (e.g., portable, laptop, desktop, server, mainframe, etc.). FIG. 19 shows an exemplary computer system 170 that includes a microprocessor 172 containing a semiconductor substrate 174 having microprocessor logic components formed therein and an interconnect structure 173, in accordance with an embodiment of the present invention, to provide electrical signals to the components. The logic components executes instructions based on signals received through the interconnect structure. The computer system may contain other conventional components electrically connected with one another including but not limited to a bus 176 to communicate data, a main memory 178, a read only memory 180, and a mass storage device 182 to store data, a display device 184 to display data, a keyboard 186 to enter data, a cursor control device 188 to enter data, and a communication device 190 to link to other electrical systems. In one instance the microprocessor receives data from a memory through the bus and communicates a representation of the data to logic components in the semiconductor substrate through the interconnect structure.

Thus, novel interconnect structures and methods for fabricating the interconnect structures have been disclosed. While the invention has been described in terms of several embodiments, those skilled in the art will recognize that the invention is not limited to the embodiments described, but can be practiced with modification and alteration within the spirit and scope of the appended claims. The description is thus to be regarded as illustrative instead of limiting.

What is claimed is:

1. A method comprising
   recessing an interconnect line relative to a dielectric layer in which the interconnect line is disposed by selectively removing material of the interconnect line relative to material of the dielectric layer;
   electrolessly depositing a conductive material over the recessed interconnect line; and
   annealing the electrolessly deposited conductive material by heating in an atmosphere including a trace amount of oxygen.

2. A method comprising
   recessing an interconnect line relative to a dielectric layer in which the interconnect line is disposed by selectively removing material of the interconnect line relative to material of the dielectric layer;
   electrolessly depositing a conductive material over the recessed interconnect line; and
   cleaning a surface of the electrolessly deposited conductive material by contacting the surface with a cleanser including an etching agent.

3. The method of claim 2, wherein said removing the material of the interconnect line comprises etching the material of the interconnect line.

4. The method of claim 3, wherein said etching the material comprises etching the material with an etching agent during a post-planarization cleaning operation.

5. The method of claim 2, wherein said cleaning the surface comprises contacting the surface with a cleanser including one or more etching agents selected from acids and oxidizers.

6. The method of claim 2, wherein said cleaning the surface comprises contacting the surface with a cleanser comprising one or more of a surfactant and an alcohol to help wet the surface.

7. The method of claim 2, wherein said cleaning the surface comprises contacting the surface with an aqueous solution including one or more selected from surfactants and alcohols to help wet the surface and one or more etching agents selected from acids and oxidizers.

8. A method comprising
   electrolessly depositing a conductive material over an interconnect structure that is disposed within a dielectric layer;
   cleaning a surface of the conductive material by contacting the surface with a cleanser including an etching agent to etch the electrolessly deposited conductive material; and
   after said cleaning, annealing the electrolessly deposited conductive material by heating the electrolessly deposited conductive material in an atmosphere including a trace amount of oxygen.

9. A method comprising:
   electrolessly depositing a conductive material over an interconnect structure that is disposed within a dielectric layer; and
   annealing the electrolessly deposited conductive material by heating the electrolessly deposited conductive material in an atmosphere including a trace amount of oxygen.

10. The method of claim 9, wherein said annealing comprises heating the electrolessly deposited conductive material to a temperature of about 450° C.

11. The method of claim 9, wherein said annealing comprises heating the electrolessly deposited conductive material in an inert atmosphere.

12. The method of claim 9, wherein said annealing comprises heating the electrolessly deposited conductive material in a reducing atmosphere.

13. The method of claim 9, further comprising, prior to said annealing, cleaning a surface of the electrolessly deposited conductive material by contacting the surface with a cleanser including an etching agent to etch the electrolessly deposited conductive material.

14. The method of claim 9, further comprising depositing a second dielectric layer over the dielectric layer and over the annealed electrolessly deposited conductive material.

15. A method comprising:
   electrolessly depositing a via plug in an opening formed in a dielectric layer, wherein the opening is at least partially over a first interconnect line, wherein the via plug includes one or more of boron and phosphorous;
   electrolessly depositing a liner layer on the electrolessly deposited via plug, wherein the liner layer includes a greater total concentration of boron and phosphorous than the via plug; and
   forming a second interconnect line on the electrolessly deposited liner layer.

16. The method of claim 15,
   wherein said electrolessly depositing the via plug comprises electrolessly depositing a composition including less than 10 atomic percent phosphorous and less than 5 atomic percent boron; and
   wherein said electrolessly depositing the liner layer comprises electrolessly depositing a composition including more than 10 atomic percent phosphorous and more than 5 atomic percent boron.

* * * * *